United States Patent
Yanase

(10) Patent No.: US 12,541,146 B2
(45) Date of Patent: Feb. 3, 2026

(54) PELLICLE FRAME, PELLICLE, METHOD FOR INSPECTING PELLICLE, PELLICLE-ATTACHED EXPOSURE ORIGINAL PLATE AND EXPOSURE METHOD, AND METHOD FOR MANUFACTURING SEMICONDUCTOR OR LIQUID CRYSTAL DISPLAY BOARD

(71) Applicant: Shin-Etsu Chemical Co., Ltd., Tokyo (JP)

(72) Inventor: Yu Yanase, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 743 days.

(21) Appl. No.: 17/793,461

(22) PCT Filed: Jan. 15, 2021

(86) PCT No.: PCT/JP2021/001196
§ 371 (c)(1),
(2) Date: Jul. 18, 2022

(87) PCT Pub. No.: WO2021/149602
PCT Pub. Date: Jul. 29, 2021

(65) Prior Publication Data
US 2023/0117335 A1    Apr. 20, 2023

(30) Foreign Application Priority Data
Jan. 20, 2020    (JP) .................... 2020-006977

(51) Int. Cl.
*G03F 1/64*    (2012.01)

(52) U.S. Cl.
CPC ..................... *G03F 1/64* (2013.01)

(58) Field of Classification Search
CPC ................ G03F 1/64; G03F 1/84; G03F 1/22
See application file for complete search history.

(56) References Cited

U.S. PATENT DOCUMENTS

| | | |
|---|---|---|
| 2013/0004711 A1 | 1/2013 | Doi et al. |
| 2014/0307237 A1 | 10/2014 | Sekihara |
| 2017/0184955 A1* | 6/2017 | Akinori .................... G03F 1/62 |
| 2017/0184956 A1 | 6/2017 | Kohmura et al. |
| 2017/0184957 A1 | 6/2017 | Kohmura et al. |
| 2018/0059536 A1 | 3/2018 | Hamada |

(Continued)

FOREIGN PATENT DOCUMENTS

| | | |
|---|---|---|
| EP | 3007206 A1 | 4/2016 |
| JP | H04-291347 A | 10/1992 |

(Continued)

OTHER PUBLICATIONS

European Search Report dated Feb. 20, 2024, issued in corresponding European Patent Application No. 21744046.0.

(Continued)

*Primary Examiner* — Stewart A Fraser
(74) *Attorney, Agent, or Firm* — Morgan, Lewis & Bockius LLP

(57) ABSTRACT

Provided are a pellicle frame, a pellicle, a method for inspecting a pellicle, a pellicle-attached exposure original plate and exposure method, and a method for manufacturing a semiconductor or a liquid crystal display board.

26 Claims, 1 Drawing Sheet

(56) References Cited

U.S. PATENT DOCUMENTS

| | | |
|---|---|---|
| 2018/0239242 A1* | 8/2018 | Kohmura .................. G03F 1/62 |
| 2019/0107774 A1 | 4/2019 | Yanase |
| 2019/0302607 A1* | 10/2019 | Taguchi .................. C22F 1/002 |
| 2019/0302608 A1 | 10/2019 | Hamada |

FOREIGN PATENT DOCUMENTS

| | | |
|---|---|---|
| JP | H05-150443 A | 6/1993 |
| JP | H09-236908 A | 9/1997 |
| JP | H11-167198 A | 6/1999 |
| JP | 2001-249442 A | 9/2001 |
| JP | 2004-012597 A | 1/2004 |
| JP | 2014-109748 A | 6/2014 |
| JP | 2014-206661 A | 10/2014 |
| JP | 2016-122092 A | 7/2016 |
| JP | 2017-040688 A | 2/2017 |
| JP | 2017-083791 A | 5/2017 |
| JP | 2017-187547 A | 10/2017 |
| JP | 2017-211516 A | 11/2017 |
| JP | 2018-031886 A | 3/2018 |
| JP | 2018-513395 A | 5/2018 |
| JP | 2019-070745 A | 5/2019 |
| JP | 2019-184666 A | 10/2019 |
| WO | 2016/043292 A1 | 3/2016 |
| WO | 2016/043301 A1 | 3/2016 |

OTHER PUBLICATIONS

Decision of Dismissal of Amendment issued in corresponding Japanese Patent Application No. 2021-573123, dated Jan. 28, 2025.
International Search Report issued in corresponding International Patent Application No. PCT/JP2021/001196 dated Mar. 9, 2021.

* cited by examiner

PELLICLE FRAME, PELLICLE, METHOD FOR INSPECTING PELLICLE, PELLICLE-ATTACHED EXPOSURE ORIGINAL PLATE AND EXPOSURE METHOD, AND METHOD FOR MANUFACTURING SEMICONDUCTOR OR LIQUID CRYSTAL DISPLAY BOARD

TECHNICAL FIELD

This invention relates to a pellicle frame which is mounted on a lithography photomask as a dust cover, pellicle, pellicle inspection method, pellicle-covered exposure original plate and exposure method, and method for manufacturing a semiconductor device or liquid crystal (LC) display panel.

BACKGROUND ART

In recent years, the miniaturization of the design rule of LSIs is in progress to the sub-quarter-micron order. Concomitantly, the exposure light source becomes shorter in wavelength. Specifically, the exposure light source makes a transition from g-line (436 nm) and i-line (365 nm) of mercury lamps to KrF excimer laser (248 nm) and ArF excimer laser (193 nm). A further study is made on the EUV lithography using extreme ultraviolet (EUV) radiation of main wavelength 13.5 nm.

In the manufacture of semiconductor devices such as LSIs and VLSIs or LC display panels, semiconductor wafers or LC matrices are exposed to light to print patterns. If dust is deposited on lithographic masks and reticles (collectively referred to as "exposure original plate," hereinafter) used herein, the dust absorbs or deflects light, raising such problems that the transferred pattern can be deformed or roughened at the edge, and the background be stained black, detracting from size, quality, appearance and other factors.

Although these operations are generally performed in a cleanroom, it is yet difficult to always maintain the exposure original plate clean. It is thus a common practice to attach a pellicle to the surface of the exposure original plate as a dust cover before exposure. In this situation, contaminants do not directly deposit on the surface of the exposure original plate, but on the pellicle. Now that a focus is set on the pattern of the exposure original plate during lithographic transfer, the contaminants on the pellicle do not participate in the transfer.

The pellicle is basically constructed such that a pellicle film having a high transmittance to radiation used in the exposure is extended on the upper end surface of a pellicle frame made of aluminum or titanium, and a gas-tight gasket is formed on the lower end surface of the pellicle frame. A pressure-sensitive adhesive (PSA) layer is generally used as the gas-tight gasket. A protective sheet is attached to the PSA layer for protection purpose. While the pellicle film is made of nitrocellulose, cellulose acetate, and fluoro-polymers which are fully transmissive to radiation used in the exposure such as g-line (436 nm) or i-line (365 nm) of mercury lamps, KrF excimer laser (248 nm) or ArF excimer laser (193 nm), a very thin silicon film or carbon film is investigated as the pellicle film for the EUV lithography.

Since the pellicle is intended to protect the exposure original plate against contamination, it is required to have a very high cleanness. It is thus necessary in the pellicle manufacturing process before shipment to carry out inspection whether or not any contaminants deposit on the pellicle film, pellicle frame, PSA layer, and protective sheet.

Most often, the inspection of the pellicle frame for contamination is carried out by directing condensing light to the frame in a darkroom and visually detecting light scattering from the contaminants. If contaminants are located on the inside surface of the pellicle frame, the contaminants readily fall down on the mask surface by vibration or air flow. Recently, it is thus more often attempted to inspect the pellicle frame inside surface by a contaminant inspector, in addition to the visual inspection. The contaminant inspector is generally designed to irradiate laser light of He—Ne laser or semiconductor laser to the pellicle frame and detect light scattering from contaminants by a semiconductor detector (CCD).

However, there is available no means for distinguishing the scattering light from the pellicle frame inner surface and the scattering light from contaminants. Since the detector detects the scattering light from the pellicle frame as well, a problem arises that correct inspection of contaminants is inhibited.

Patent Document 1 describes that the inspection ability is improved by reducing the reflectance of the pellicle frame inside surface to or below 0.3% relative to inspection light of 400 to 1,100 nm. However, in order to reduce the reflectance relative to light of 400 to 1,100 nm to or below 0.3%, it is necessary that the frame be colored black as closely as possible. To achieve the desired coloring, the pellicle frame material and the coloring method must be strictly selected. With certain materials, it is impossible to achieve the desired coloring.

Also, since the wavelength range of He—Ne laser or semiconductor laser used as the inspection light is limited, for example, to the range of 640 to 660 nm, it is not essentially necessary to reduce the reflectance in the overall wavelength region of 400 to 1,100 nm.

PRIOR ART DOCUMENTS

Patent Documents

Patent Document 1: JP-A 2001-249442

SUMMARY OF INVENTION

Technical Problem

An object of the invention, which has been made under the above-mentioned circumstances, is to provide a pellicle frame in which the contaminant inspection ability is improved by reducing the reflectance on the pellicle frame inside surface relative to inspection light to minimize the scattering light from the frame, and coloring and other restrictions on the pellicle frame are mitigated by reducing the reflectance relative to only the wavelength of inspection light; a pellicle comprising the pellicle frame; and a method of inspecting the pellicle.

Solution to Problem

Regarding a pellicle frame in a frame shape having an upper end surface adapted to bear a pellicle film and a lower end surface adapted to face a photomask, the inventor has found that when the pellicle frame is adjusted so as to have on its inside surface a minimum reflectance of up to 20% at a light source wavelength of 500 to 1,000 nm, the scattering light from the pellicle frame is minimized, and when a specific wavelength at which the reflectance is 20% or lower is used as the wavelength of inspection light to reduce the reflectance relative to only the wavelength of inspection light, substantial limits on surface treatments such as pellicle frame coloring method are eliminated; that is, a pellicle frame having a satisfactory inspection ability is obtained. The invention is predicated on this finding.

Accordingly, the invention provides a pellicle frame, pellicle, pellicle inspection method, pellicle-covered exposure original plate and exposure method, and method for manufacturing a semiconductor device or LC display panel as defined below.

1. A pellicle frame in a frame shape having an upper end surface adapted to bear a pellicle film and a lower end surface adapted to face a photomask, the pellicle frame having, on at least an inside surface thereof, a minimum reflectance of up to 20% at a light source wavelength of 500 to 1,000 nm.
2. The pellicle frame of 1 wherein the minimum reflectance is up to 10%.
3. The pellicle frame of 1 or 2 wherein the reflectance is up to 20% at any wavelength over the light source wavelength of 500 to 1,000 nm.
4. The pellicle frame of 1 or 2 wherein the reflectance is up to 10% at any wavelength over the light source wavelength of 500 to 1,000 nm.
5. The pellicle frame of 1 or 2 wherein on the overall side surface of the pellicle frame, the minimum reflectance is up to 20% at the light source wavelength of 500 to 1,000 nm.
6. The pellicle frame of 1 or 2 wherein the material of which the pellicle frame is made contains titanium or a titanium alloy.
7. The pellicle frame of 1 or 2 wherein the material of which the pellicle frame is made contains aluminum or an aluminum alloy.
8. The pellicle frame of 1 or 2, having a thickness of less than 2.5 mm.
9. The pellicle frame of 1 or 2, having a thickness of less than 1.5 mm.
10. The pellicle frame of 1 or 2 wherein an oxide coating is formed on the surfaces of the pellicle frame.
11. The pellicle frame of 1 or 2 wherein the surfaces of the pellicle frame are blackened.
12. The pellicle frame of 1 or 2 wherein the surfaces of the pellicle frame have been subjected to flaw-hiding treatment.
13. The pellicle frame of 1 or 2 wherein the surfaces of the pellicle frame have been subjected to manual polishing treatment, sand blasting treatment, chemical polishing treatment or electrolytic polishing treatment.
14. The pellicle frame of 1 or 2 which is used in an EUV lithography pellicle.
15. A pellicle comprising the pellicle frame of 1 and a pellicle film disposed on one end surface of the pellicle frame via a pressure-sensitive adhesive or adhesive.
16. The pellicle of 15 wherein the pellicle film is disposed on the upper end surface of the pellicle frame.
17. The pellicle of 15 or 16 wherein the pellicle film is a silicon film or carbon film.
18. The pellicle of 15 or 16, having a height of up to 2.5 mm.
19. The pellicle of 15 or 16 which is used in the EUV lithography.
20. A pellicle inspection method comprising the step of detecting contaminants in the pellicle of 15 by means of a contaminant inspector, wherein
    the step of detecting contaminants in the pellicle uses inspection light having such a specific wavelength that the reflectance on at least the inside surface of the pellicle frame is up to 20%.
21. A pellicle-covered exposure original plate comprising an exposure original plate and the pellicle of 15 mounted thereon.
22. The pellicle-covered exposure original plate of 21 wherein the exposure original plate is an exposure original plate for the EUV lithography.
23. The pellicle-covered exposure original plate of 21 which is a pellicle-covered exposure original plate for use in the EUV lithography.
24. An exposure method comprising the step of exposing to radiation through the pellicle-covered exposure original plate of 21.
25. The exposure method of 24 wherein a light source for the exposure is a light source capable of emitting EUV radiation.
26. A method for manufacturing a semiconductor device comprising the step of exposing a semiconductor wafer to radiation through the pellicle-covered exposure original plate of 21.
27. The semiconductor manufacturing method of 26 wherein a light source for the exposure is a light source capable of emitting EUV radiation.
28. A method for manufacturing a liquid crystal display panel comprising the step of exposing a liquid crystal matrix to radiation through the pellicle-covered exposure original plate of 21.
29. The liquid crystal display panel manufacturing method of 28 wherein a light source for the exposure is a light source capable of emitting EUV radiation.

Advantageous Effects of Invention

The pellicle frame, pellicle, and pellicle inspection method according to the invention have the following advantages. The pellicle frame can be surface-treated such that the scattering light from the pellicle frame is reduced as largely as possible and a specific wavelength at which the reflectance of the pellicle frame is 20% or lower is used as the wavelength of inspection light whereby the reflectance is reduced relative to only that wavelength of inspection light. The freedom of surface treatment becomes higher. The resulting pellicle frame is convenient to inspect.

DESCRIPTION OF EMBODIMENTS

Figure 1:
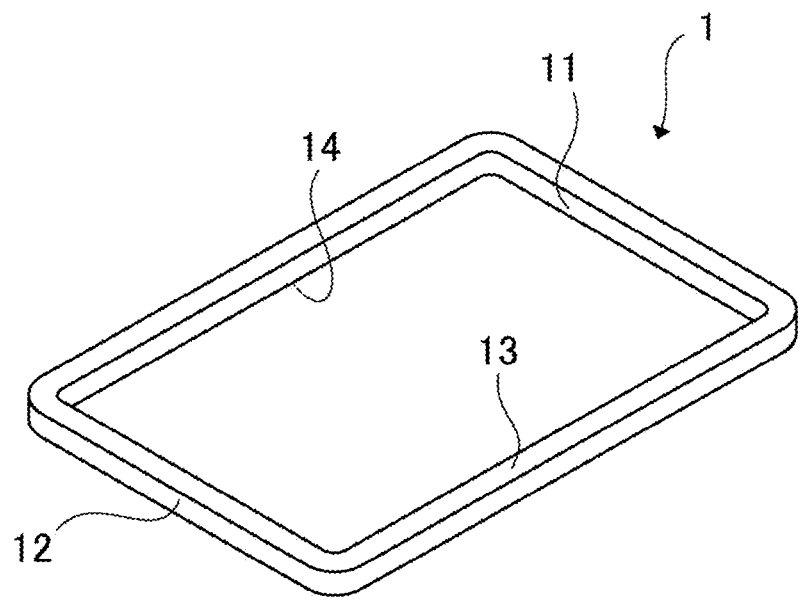
FIG. 1 is a perspective view of a pellicle frame in one embodiment of the invention.

Now the invention is described in detail.

The invention provides a pellicle frame in a frame shape having an upper end surface adapted to bear a pellicle film and a lower end surface adapted to face a photomask.

As long as the pellicle frame is in a frame shape, its shape corresponds to the shape of a photomask on which a pellicle is mounted. In general, it is a four-sided (rectangular or square) frame. Besides the rectangular frame-shape, the shape may be changed to the shape of a photomask, for example, a polygonal shape such as triangular, pentagonal, hexagonal or octagonal shape, a circular shape, or an elliptic shape. It is noted that the polygonal frame shape, typically rectangular frame shape encompasses shapes whose corners or edges are horned or chamfered such as by chamfering, rounding or deburring.

The pellicle frame further has a surface (referred to as upper end surface) on which a pellicle film is to be extended and a surface (referred to as lower end surface) adapted to face a photomask when the frame is mounted on the photomask.

In general, the pellicle frame is provided on the upper end surface with a pellicle film via an adhesive and on the lower end surface with a PSA layer for mounting the pellicle on the photomask although the invention is not limited thereto.

While the material of the pellicle frame is not particularly limited, any well-known material may be used. Since the pellicle frame for the EUV lithography can be exposed to high temperature, a material having a low coefficient of thermal expansion is preferred. Exemplary materials include Si, $SiO_2$, SiN, quartz, Invar, titanium and titanium alloys. Inter alia, titanium and titanium alloys are preferred for ease of working and light weight.

The size of the pellicle frame is not particularly limited. Since the height of the pellicle for the EUV lithography is limited to 2.5 mm or less, the thickness of the pellicle frame for the EUV lithography is smaller than the height, i.e., less than 2.5 mm. The thickness of the pellicle frame for the EUV lithography is preferably equal to or less than 1.5 mm in view of the thickness of the pellicle film and mask PSA.

The pellicle frame is subjected to such surface treatment that it may have, on at least the inside surface thereof, a minimum reflectance of up to 20% in a wavelength range of 500 to 1,000 nm. In particular, the pellicle frame preferably has on the overall inside surface a minimum reflectance of up to 20% in the light source wavelength range. The pellicle frame is surface-treated so as to meet this requirement. While the surface treatment method is not particularly limited, for example, anodizing treatment may be carried out to form an oxide coating of 100 μm on the surface to develop blue color by interference colors, or black nickel plating treatment may be carried out for blackening. Also, the oxide coating may be doped with carbon to blacken the frame surface.

For the pellicle frame of the invention, it is unnecessary that the reflectance is up to 20% at any wavelength in the wavelength range of 500 to 1,000 nm. It suffices that the reflectance is up to 20% at a specific wavelength in the wavelength range. As used herein, the specific wavelength refers to the wavelength of inspection light used in the contaminant inspector. It is preferred that the reflectance is up to 20% at this wavelength, more preferably up to 10% at this wavelength. Inversely, the inspection light used in the contaminant inspector may be selected from the reflectance distribution representative of the minimum reflectance of the pellicle frame.

To improve an inspection ability, the surfaces of the pellicle frame may be subjected to flaw-hiding treatment such as manual polishing treatment, sand blasting treatment, chemical polishing treatment or electrolytic polishing treatment. These surface treatments are effective for roughening the surface to inhibit the scattering light from the pellicle frame as fully as possible.

Also, the side surface of the pellicle frame is typically provided with a jig hole which is utilized during handling or dismounting of the pellicle from the photomask. With respect to the size of the jig hole, the length of the jig hole in thickness direction of the pellicle frame (diameter in the case of a circular hole) is 0.5 to 1.0 mm. While the shape of the hole is not particularly limited, it may be either circular or rectangular.

The pellicle frame is also provided with an air passage, which may be provided with a filter for preventing contaminants from penetrating therethrough.

The pellicle of the invention includes the pellicle frame and a pellicle film disposed on the upper end surface thereof via a PSA or adhesive. While the material of the PSA or adhesive is not particularly limited, any well-known ones may be used. A PSA or adhesive having a strong bonding force is preferred for firmly holding the pellicle film.

While the material of the pellicle film is not particularly limited, a material having a high transmittance at the wavelength of the exposure light source and high light resistance is preferred. For example, a very thin silicon film or carbon film is used in the EUV lithography. Examples of the carbon film include films of graphene, diamond-like carbon, and carbon nanotubes. While the pellicle film is not limited to a thin film, an assembly of a pellicle film and a support frame for supporting the film may also be employed. For example, a method of preparing a pellicle film by forming a pellicle film on a silicon wafer, and performing back etching on the silicon wafer only in a region to serve as a pellicle film for thereby removing the silicon wafer is acceptable. In this embodiment, the pellicle film is obtained as supported by the silicon frame.

Further, the pellicle frame is provided on the lower end surface with a mask PSA for mounting the frame on a photomask. In general, the mask PSA is preferably extended along the overall periphery of the pellicle frame.

The mask PSA used herein may be any of well-known ones, with acrylic PSA and silicone-based PSA being preferably used. The PSA may be worked to any desired shape if necessary.

To the lower end surface of the mask PSA, a release layer or separator may be attached for protecting the PSA. While the material of the release layer is not particularly limited, use may be made of polyethylene terephthalate (PET), polytetrafluoroethylene (PTFE), tetrafluoroethylene-perfluoroalkyl vinyl ether copolymers (PFA), polyethylene (PE), polycarbonate (PC), polyvinyl chloride (PVC), and polypropylene (PP), for example. Also, if necessary, such release agents as silicone-based release agents and fluorinated release agents may be coated on the surface of the release layer. In mounting the pellicle to the photomask, it is possible to secure the pellicle by physical securing means, besides the mask PSA. Suitable securing means include screws, bolts, nuts, rivets, keys and pins. It is also possible to use the mask PSA and the physical securing means in combination.

Referring to FIG. 1, a pellicle frame 1 in one embodiment of the invention is illustrated. The pellicle frame has an inside surface 11, an outside surface 12, an upper end surface 13, and a lower end surface 14. Although the pellicle frame is typically provided on its longer side with a jig hole which is utilized in dismounting the pellicle from the photomask, the hole is not depicted in FIG. 1.

Figure 2:
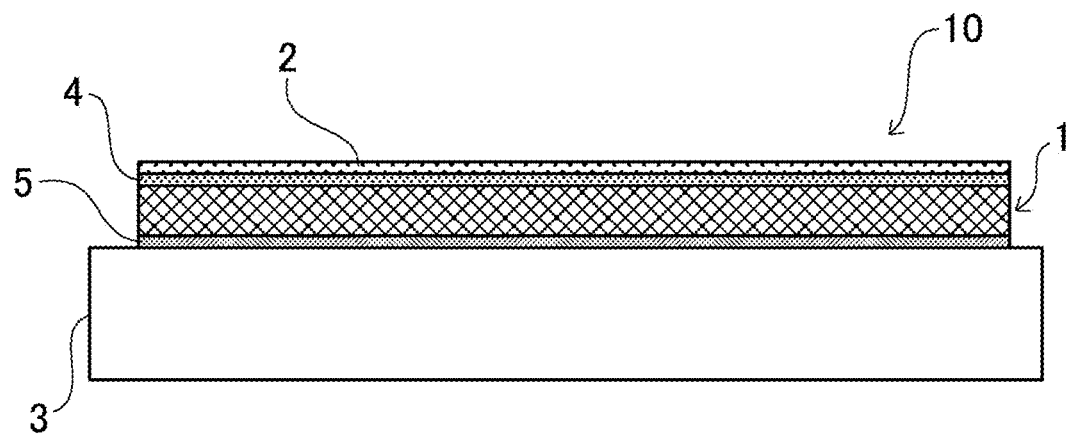
FIG. 2 is a schematic view showing the pellicle of the invention mounted on a photomask.

FIG. 2 illustrates a pellicle 10. On the upper end surface of the pellicle frame 1, a pellicle film 2 is extended and bonded with an adhesive 4. The lower end surface of the pellicle frame 1 is releasably bonded to a photomask 3 via a PSA 5 for protecting the patterned surface of the photomask 3.

The pellicle of the invention may serve not only as a protective member for protecting an exposure original plate from particulate contamination in an EUV exposure unit, but also as a protective member for protecting an exposure original plate during its storage or transportation. In preparing a pellicle-covered exposure original plate by mounting a pellicle on an exposure original plate, typically photomask, an electrostatic chucking method, mechanical securing method or the like may be used as well as the aforementioned method of bonding with the mask PSA.

A further embodiment of the invention is a method for manufacturing a semiconductor device or LC display panel, which includes the step of exposing a substrate (semiconductor wafer or LC matrix) to radiation through the pellicle-covered exposure original plate. For example, in the lithography step which is one of the steps of the process of manufacturing a semiconductor device or LC display panel, the stepper is installed with the pellicle-covered exposure original plate and exposure is performed to form a photoresist pattern corresponding to an integrated circuit or the like on a substrate. In general, a projection optical system is used in the EUV lithography such that EUV radiation is reflected by the exposure original plate and directed to the substrate. The exposure step is performed under reduced pressure or in vacuum. Even when contaminants deposit on the pellicle in the lithography step, the contaminants are out of focus on the photoresist-coated wafer, preventing the images of contaminants from causing short- or open-circuiting in the integrated circuit. Therefore, the yield of the lithography step can be improved by using the pellicle-covered exposure original plate.

EXAMPLES

Examples and Comparative Examples are given below for illustrating the invention, but the invention is not limited thereto.

Example 1

A pellicle frame (outer dimensions 150 mm×118 mm×1.5 mm, width 4.0 mm) of titanium was furnished. The titanium frame was immersed in an electrolytic mixture of phosphoric acid, sulfuric acid and hydrogen peroxide wherein anodization was performed under conditions including temperature 25° C., voltage 20 volts, and time 30 minutes to form an oxide coating for developing blue color, interference color. The pellicle frame was washed with neutral detergent and deionized water. A material obtained by adding 1 part by weight of curing agent (PT-56 by Shin-Etsu Chemical Co., Ltd.) to 100 parts by weight of silicone PSA (X-40-3264 by Shin-Etsu Chemical Co., Ltd.) and stirring was coated onto the upper end surface of the frame to form a PSA layer of 1 mm wide and 0.1 mm thick. A material obtained by adding 0.1 part by weight of curing agent (L-45 by Soken Chemical & Engineering Co., Ltd.) to 100 parts by weight of acrylic PSA (SK-Dyne 1495 by Soken Chemical & Engineering Co., Ltd.) and stirring was coated onto the lower end surface of the frame to form a layer of 1 mm wide and 0.1 mm thick along the overall periphery. Thereafter, the pellicle frame was heated at 90° C. for 12 hours to cure the PSA layers on the upper and lower end surfaces. Subsequently, a very thin silicon film as the pellicle film was compression bonded to the PSA layer on the upper end surface of the pellicle frame to complete a pellicle.

Example 2

After a titanium frame was furnished, anodization, black dying and sealing treatment were sequentially performed to form a black oxide coating on the frame surface. Except this coloring treatment of the frame surface, the procedure was the same as in Example 1.

Example 3

After a frame of aluminum alloy was furnished, anodization, black dying and sealing treatment were sequentially performed to form a black oxide coating on the frame surface. Except the frame material and surface treatment, the procedure was the same as in Example 1.

Comparative Example 1

The procedure was the same as in Example 1 except that no surface treatment was performed on the titanium pellicle frame.

On the pellicles obtained in Examples 1 to 3 and Comparative Example 1, inspection was performed by a contaminant inspector. Also, sample pieces were obtained by using the same frame material and carrying out the same surface treatment as in Examples 1 to 3 and Comparative Example 1, after which they were measured for reflectance.
[Reflectance Measurement]
A sample was prepared by furnishing a sample piece of 3 cm×3 cm×5 mm (thick) and carrying out the same surface treatment as in Examples 1 to 3 and Comparative Example 1. A reflectance at 500 to 1,000 nm was measured by a spectrophotometer model V-780 (Jasco Corp.). Table 1 shows measured values of minimum reflectance and reflectance at the inspection light (532 nm). The minimum reflectance was identified from the chart obtained from the spectrophotometer. Laser light of 532 nm is selected as the inspection light because such a semiconductor laser is compact and easy to incorporate in the system, yet shows stable performance, and has been actually used as the inspection unit in the semiconductor technology.
[Contaminant Inspection]
After the pellicle prepared above was held by a special jig in engagement with a jig hole, standard particles of 20 μm were deposited on a portion of the inner wall of the pellicle frame. The jig together with the pellicle was set in an inner surface contaminant inspection equipment equipped with a semiconductor laser of wavelength 532 nm (Shin-Etsu Engineering Co., Ltd.). The results of inspection of contaminants on the inner wall were evaluated good (◯) or poor (x) according to the following criterion.
<Judgment Criterion>
  ◯: no scattering light was acknowledged in the region where no particles were deposited, and scattering light was acknowledged only in the region where particles were deposited
  x: scattering light was acknowledged even in the region where no particles were deposited

TABLE 1

|  | Minimum reflectance (%) | Wavelength of minimum reflectance (nm) | Reflectance at 532 nm (%) | Contaminant inspection |
| --- | --- | --- | --- | --- |
| Example 1 | 3.7 | 522 | 3.7 | ◯ |
| Example 2 | 16.9 | 852 | 18.1 | ◯ |
| Example 3 | 5 | 500 | 5.2 | ◯ |
| Comparative Example 1 | 39.1 | 500 | 41 | X |

From the results shown in Table 1, the following considerations are drawn.

On use of the pellicle frames of Examples 1 to 3 wherein the reflectance of the inspection light (532 nm) from the pellicle frame is equal to or less than 20%, there are available pellicles which are amenable to inspection by the contaminant inspector. By contrast, on use of the pellicle frame of Comparative Example 1, the pellicle is not concluded amenable to inspection because scattering light from the frame is acknowledged even in the region where no particles are deposited.

REFERENCE SIGNS LIST 1 pellicle frame
2 pellicle film
3 photomask
4 pellicle film adhesive
5 photomask PSA
10 pellicle

The invention claimed is:

1. A pellicle frame in a frame shape having an upper end surface adapted to bear a pellicle film and a lower end surface adapted to face a photomask, the pellicle frame having, on at least an inside surface thereof, a minimum reflectance of up to 20% at a light source wavelength of 500 to 1000 nm, wherein
the material of which the pellicle frame is made contains titanium or a titanium alloy, and
an oxide coating for developing blue color by interference colors is formed on a surface of the pellicle frame.

2. The pellicle frame of claim 1 wherein the minimum reflectance is up to 10%.

3. The pellicle frame of claim 1 wherein the reflectance is up to 20% at any wavelength over the light source wavelength of 500 to 1000 nm.

4. The pellicle frame of claim 1 wherein the reflectance is up to 10% at any wavelength over the light source wavelength of 500 to 1000 nm.

5. The pellicle frame of claim 1 wherein on the overall side surface of the pellicle frame, the minimum reflectance is up to 20% at the light source wavelength of 500 to 1000 nm.

6. The pellicle frame of claim 1 wherein the material of which the pellicle frame is made contains aluminum or an aluminum alloy.

7. The pellicle frame of claim 1, having a thickness of less than 2.5 mm.

8. The pellicle frame of claim 1, having a thickness of less than 1.5 mm.

9. The pellicle frame of claim 1 wherein the surfaces of the pellicle frame are blackened.

10. The pellicle frame of claim 1 wherein the surfaces of the pellicle frame have been subjected to flaw-hiding treatment.

11. The pellicle frame of claim 1 wherein the surfaces of the pellicle frame have been subjected to manual polishing treatment, sand blasting treatment, chemical polishing treatment or electrolytic polishing treatment.

12. The pellicle frame of claim 1 which is used in an EUV lithography pellicle.

13. A pellicle comprising the pellicle frame of claim 1 and a pellicle film disposed on one end surface of the pellicle frame via a pressure-sensitive adhesive or adhesive.

14. The pellicle of claim 13 wherein the pellicle film is disposed on the upper end surface of the pellicle frame.

15. The pellicle of claim 13 wherein the pellicle film is a silicon film or carbon film.

16. The pellicle of claim 13, having a height of up to 2.5 mm.

17. The pellicle of claim 13 which is used in the EUV lithography.

18. A pellicle inspection method comprising the step of detecting contaminants in the pellicle of claim 13 by means of a containment inspector, wherein
the step of detecting contaminants in the pellicle uses inspection light having such a specific wavelength that the reflectance on at least the inside surface of the pellicle frame is up to 20%.

19. A pellicle-covered exposure original plate comprising an exposure original plate and the pellicle of claim 13 is mounted thereon.

20. The pellicle-covered exposure original plate of claim 19 wherein the exposure original plate is an exposure original plate for the EUV lithography.

21. An exposure method comprising the step of exposing to radiation through the pellicle-covered exposure original plate of claim 19.

22. The exposure method of claim 21 wherein a light source for the exposure is a light source capable of emitting EUV radiation.

23. A method for manufacturing a semiconductor device comprising the step of exposing a semiconductor wafer to radiation through the pellicle-covered exposure original plate of claim 19.

24. The semiconductor manufacturing method of claim 23 wherein a light source for the exposure is a light source capable of emitting EUV radiation.

25. A method for manufacturing a liquid crystal display panel comprising the step of exposing a liquid crystal matrix to radiation through the pellicle-covered exposure original plate of claim 19.

26. The liquid crystal display panel manufacturing method of claim 25 wherein a light source for the exposure is a light source capable of emitting EUV radiation.

* * * * *